United States Patent
Nikolaev et al.

(10) Patent No.: US 9,720,053 B2
(45) Date of Patent: Aug. 1, 2017

(54) MAGNETIC SENSOR ANNEALING USING A ROCKING FIELD

(71) Applicant: Seagate Technology LLC, Cupertino, CA (US)

(72) Inventors: Konstantin Nikolaev, Bloomington, MN (US); Victor Sapozhnikov, Minnetonka, MN (US); Taras Pokhil, Arden Hills, MN (US); Jae-Young Yi, Prior Lakes, MN (US); Mohammed Patwari, Eden Prairie, MN (US); Eric W. Singleton, Maple Plain, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/840,411

(22) Filed: Aug. 31, 2015

(65) Prior Publication Data
US 2015/0369879 A1 Dec. 24, 2015

Related U.S. Application Data

(62) Division of application No. 14/292,414, filed on May 30, 2014, now Pat. No. 9,147,409.

(51) Int. Cl.
| | | |
|---|---|---|
| G11B 5/39 | (2006.01) | |
| G01R 33/00 | (2006.01) | |
| C21D 1/04 | (2006.01) | |
| G01R 33/09 | (2006.01) | |
| H01F 7/06 | (2006.01) | |
| C21D 1/34 | (2006.01) | |
| G11B 5/00 | (2006.01) | |

(52) U.S. Cl.
CPC .......... *G01R 33/0052* (2013.01); *C21D 1/04* (2013.01); *C21D 1/34* (2013.01); *G01R 33/091* (2013.01); *G11B 5/3903* (2013.01); *G11B 5/3932* (2013.01); *H01F 7/064* (2013.01); *C21D 2201/05* (2013.01); *G11B 2005/0008* (2013.01); *G11B 2005/3996* (2013.01); *Y10T 29/49034* (2015.01)

(58) Field of Classification Search
None
See application file for complete search history.

(56) References Cited

U.S. PATENT DOCUMENTS

| | | | |
|---|---|---|---|
| 4,475,962 A | 10/1984 | Hayakawa et al. | |
| 4,994,320 A * | 2/1991 | Jagielinski | G11B 5/8408 204/192.2 |
| 6,217,672 B1 | 4/2001 | Zhang | |
| 6,721,145 B2 | 4/2004 | Beach | |
| 7,160,738 B2 | 1/2007 | Deak | |
| 7,905,758 B2 * | 3/2011 | Millstein | A63H 33/26 446/129 |
| 8,111,489 B2 | 2/2012 | Fuji et al. | |
| 2004/0042129 A1 * | 3/2004 | Mizuguchi et al. | G11C 11/15 360/324.2 |

(Continued)

*Primary Examiner* — Craig A. Renner
(74) *Attorney, Agent, or Firm* — Holzer Patel Drennan

(57) ABSTRACT

Implementations described and claimed herein provide a system comprising an external magnetic field generator, wherein the external field magnetic field generator is configured to rock an effective annealing magnetic field between a first positive angle and a second negative angle compared to a desired pinning field orientation in an AFM/PL structure.

6 Claims, 7 Drawing Sheets

(56) References Cited

U.S. PATENT DOCUMENTS

2005/0087519 A1* 4/2005 Klostermann et al. ........... H01L 21/67115
219/121.66
2006/0226940 A1 10/2006 Lee et al.
2011/0225881 A1* 9/2011 Levengood ............. A01C 1/02
47/58.1 SE

* cited by examiner

MAGNETIC SENSOR ANNEALING USING A ROCKING FIELD

CROSS-REFERENCE TO RELATED APPLICATION

The present application is a divisional application of U.S. patent application Ser. No. 14/292,414 filed May 30, 2014, and titled "Magnetic Sensor Annealing Using A Rocking Field", and expected to issue on Sep. 29, 2015 as U.S. Pat. No. 9,147,409, which is hereby incorporated by reference in its entirety.

BACKGROUND

In a magnetic data storage and retrieval system, a magnetic read/write head typically includes a reader portion having a magnetoresistive (MR) sensor for retrieving magnetically encoded information stored on a magnetic disc. Magnetic flux from the surface of the disc causes rotation of the magnetization vector of a sensing layer of the MR sensor, which in turn causes a change in electrical resistivity of the MR sensor. The change in resistivity of the MR sensor can be detected by passing a current through the MR sensor and measuring a voltage across the MR sensor. External circuitry then converts the voltage information into an appropriate format and manipulates that information as necessary to recover the information encoded on the disc.

SUMMARY

Implementations described and claimed herein provide a system comprising an external magnetic field generator, wherein the external field magnetic field generator is configured to rock an effective annealing magnetic field between a first positive angle and a second negative angle compared to a desired pinning field orientation in an AFM/PL structure.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

BRIEF DESCRIPTIONS OF THE DRAWINGS

DETAILED DESCRIPTIONS

Figure 1:
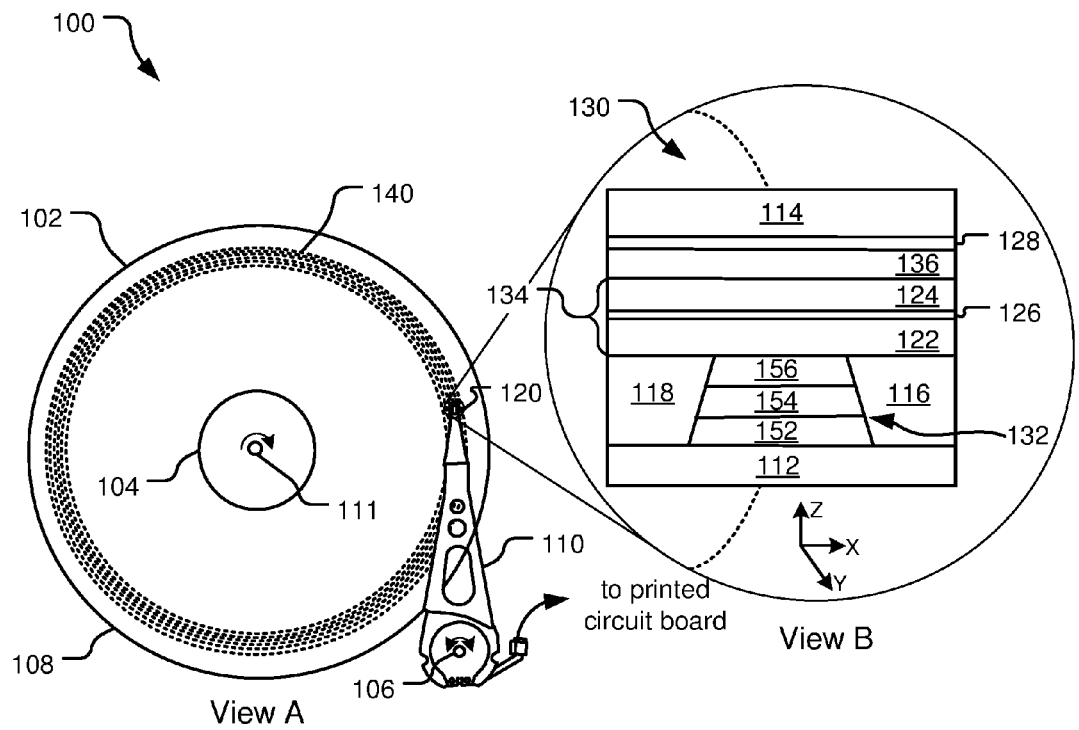
FIG. 1 illustrates a plan view of an example disk drive assembly and an exploded air-bearing surface-facing view of an example MR sensor stack.

There is an ever increasing demand for high data densities that require sensitive sensors to read data from a magnetic media. Thin film MR multilayers form the heart of MR readers and their quality has a very strong impact on reader performance.

A MR sensor in a reader can include an AFM layer, a PL, a spacer layer, and a free layer. The PL may be a single ferromagnetic layer or may make up a synthetic antiferromagnet structure consisting of two antiferromagnetically coupled ferromagnetic layers. Magnetization of the PL is usually fixed by exchange coupling with a layer of AFM. While AFM material itself does not have a net magnetic moment, when AFM is exchange-coupled with the PL, it can strongly pin the magnetization of the PL. AFM has magnetic anisotropy along one or more axes. For the disclosed technology, methods are described assuming that AFM has uniaxial magnetic anisotropy with random in-plane easy axes orientation for each individual grain. However, the disclosed technology is also valid in a case of multiple anisotropy axes in each AFM grain.

As MR sensors decrease in size, the effects of pinning dispersion play an increasing role. Higher dispersion can lead to AFM-induced instabilities and even polarity reversals. Therefore, having lower pinning dispersion provides improved performance and stability. In one implementation, this is accomplished by annealing the AFM/PL structure. Annealing is a heat treatment process that allows to overcome the activation barrier for setting AFM grains in a desired orientation. External magnetic field applied during anneal aligns the PL along the annealing magnetic field and affects AFM via exchange interaction at the AFM/PL interface.

The PL of the MR sensor is coupled to the top sub-lattice of AFM layer by interface exchange interaction. This creates energy preference in favor of one of the two directions of the easy axis in a grain of the AFM layer. Therefore, at high enough temperature, the grain that happened to have magnetization in the unfavorable direction can flip to the preferred direction. The effective annealing magnetic field continues to be applied while the temperature is reduced. After anneal, at a lower temperature, the probability of the magnetic orientation of AFM grain to switch is greatly reduced. In this more fixed state, the AFM then forces its magnetic direction on the PL and the exchange coupling between the AFM layer the PL pins the PL in a desired orientation.

High temperature anneal process in an external magnetic field involves heating the AFM/PL structure, which causes the magnetization orientation of the PL to follow the external magnetic field and the PL to provide torque to the AFM grains. This process orients the magnetization of the AFM grains to have a component in the direction of the effective annealing magnetic field. Upon releasing the effective annealing magnetic field, the AFM grains can relax to the closest easy axis which has a component in the direction of the anneal field.

However, when there is a grain that is oriented nearly opposite to the direction of the effective annealing magnetic field, the torque exerted by the effective annealing magnetic field during anneal may not be sufficient to re-orient the grain because of very acute angle between the direction of the effective annealing magnetic field and the grain's easy axis. The change in grain orientation is especially difficult if the grain is large. As a result, the grain orientation may not flip during anneal, as shown further below in FIG. 3(b). The resulting misorientation of various AFM grains may locally distort the magnetization of the PL, resulting in instabilities and possible flipping of other AFM grains within the MR sensor.

Instabilities associated with the AFM layer can be a cause of reader performance degradation. The inability to properly set AFM grains during stack anneal is one cause of these instabilities.

The disclosed technology provides an annealing technique that improves AFM grain dispersion by rocking the effective annealing magnetic field during anneal. An implementation disclosed herein provides grain dispersion where a reduced number of grains that locally pin the PL in the direction with a component opposing average pinning field. This method enables aligning magnetic orientation of AFM grains that cannot be aligned by the standard static field anneal (such as larger AFM grains or AFM grains with easy axis orientation nearly opposite the direction of the external magnetic field). Alternatively, better magnetic alignment of AFM grains can be achieved at a lower anneal temperature. As a result, other parts of the reader stack and other parts of the reader (shields, for example) may benefit from not being exposed to excessively high temperature. Alternatively, using this technique, AFM grains can still be set at a reasonable temperature of anneal even with reduced exchange at the AFM/PL interface.

In one implementation of the disclosed technology, first an effective annealing magnetic field is applied at substantially −90° to the desired direction of pinning field. Then, the magnetic field is rocked, for example, from −90° to +80°, then from +80° to −70°, etc. This rocking process continues, wherein the rocking angle gradually decreases, until finally the direction of the external magnetic field to the direction of the desired pinning field orientation of 0° is reached. The series of high torques helps orient the magnetization of AFM grain, including even the large AFM grains or the grains with initial easy axis orientation substantially opposite (that are originally oriented at close to 180°) to the desired orientation of pinning. Subsequently, upon removal of the effective annealing magnetic field, these grains relax to an easy axis orientation closest to 0° from the desired easy axis orientation rather than stay at an easy axis close to 180° orientation.

The disclosed technology achieves better alignment of AFM grain orientation. Furthermore, better orientation of the AFM grain magnetizations enhances the stability of the AFM layer of the sensor stack.

FIG. 1 illustrates a plan view of an example disk drive assembly 100. The example disk drive assembly 100 includes a slider 120 on a distal end of an actuator arm 110 positioned over a media disk 108. A rotary voice coil motor that rotates about an actuator axis of rotation 106 is used to position the slider 120 on a data track (e.g., a data track 140) and a spindle motor that rotates about disk axis of rotation 111 is used to rotate the media disk 108. Referring specifically to View A, the media disk 108 includes an outer diameter 102 and an inner diameter 104 between which are a number of data tracks, such as a data track 140, illustrated by circular dotted lines.

The slider 120 includes a writer section (not shown) and one or more MR sensors for reading data off of the media disk 108. View B illustrates a side of an example MR sensor 130 that faces an air-bearing surface (ABS) of the media disk 108 when the disk drive assembly 100 is in use. Thus, the MR sensor 130 shown in View B may be rotated by about 180 degrees about (e.g., about a z-axis) when operationally attached to the slider 120 shown in View A.

The MR sensor 130 of the slider 120 includes a sensor stack 132 that has a plurality of layers that perform a plurality of functions. In various implementations, the functionality and number of such layers may vary. However, the sensor stack 132 includes at least a magnetic layer with a magnetic moment that is free to rotate in response to an applied magnetic field. The data bits on the media disk 108 are magnetized in a direction normal to the plane of FIG. 1, either into the plane of the figure, or out of the plane of the figure. Thus, when the MR sensor 130 passes over a data bit, the magnetic moment of the free layer is rotated either into the plane of FIG. 1 or out of the plane of FIG. 1, changing the electrical resistance of the MR sensor 130. The value of the bit being sensed by the MR sensor 130 (e.g., either 1 or 0) may therefore be determined based on the current flowing through the sensor stack 132. In one implementation, the sensor stack 132 may include an AFM layer 152, a synthetic antiferromagnet (SAF) layer 154 and a free layer (FL) 156. The sensor stack 132 may also include other layers that are not disclosed herein. The SAF layer 154 may further include a PL, a reference layer (RL), and a ruthenium layer separating the PL and the RL (none of these layers are shown herein). Specifically, the PL of the SAF layer 154 is contact with the AFM layer 152.

Side shield elements 116 and 118 provide a stabilizing bias to the FL of the sensor stack 132. The side shields 116 and 118 are positioned adjacent to the sensor stack 132 in the cross-track (x-direction). In the down-track direction (z-direction), the sensor stack 132 is positioned between shield element 112 and a SAF structure 134, which includes a PL 124, a spacer coupling layer 126, and a RL 122. The shield element 112 and SAF structure 134 isolate the sensor stack 132 from electromagnetic interference, primarily z-direction interference, and serve as electrically conductive first and second electrical leads connected to processing electronics (not shown).

In operation, a bit along a data track 140 on the media disk 108 consecutively passes under the shield element 112, the sensor stack 132, the SAF structure 134, an adjacent AFM layer 136, a capping layer 128, and a shield element 114. Therefore, the edge of the sensor stack 132 proximal to the shield element 112 may be referred to as the "leading edge" of the sensor stack and the edge of the sensor stack 132 proximal to the shield element 114 may be referred to as the "trailing edge" of the sensor stack.

In FIG. 1, the leading edge of the sensor stack 132 is in contact with the shield element 112. In other implementations, one or more layers may be interleaved between the sensor stack 132 and the shield element 112.

The leading edge of the sensor stack 132 is adjacent to the SAF structure 134. The pinned layer 124 has a magnetic moment that is biased by the AFM layer 136. The direction of such biasing is in a direction that is substantially anti-parallel to the magnetic orientation of the RL 122. These antiparallel magnetic orientations are due to an antiferromagnetic coupling across the spacer coupling layer 126. The capping layer 128 is in contact with the AFM layer 136 and serves to magnetically decouple the AFM layer 136 from the adjacent shield element 114.

In one implementation, the AFM layer 152 includes a plurality of grains wherein the magnetic orientation of the AFM grains may be set using a rocking anneal method.

Specifically, during anneal process of the sensor stack 132, the wafer including the sensor stack 132 is under application of an effective external magnetic field that is rocked between a range of substantially 180 degrees. Such effective rocking of the external magnetic field may be achieved by either keeping a sensor stack wafer static and rocking the external magnetic field between a range of substantially 180 degrees or by keeping the external magnetic field static and rocking the sensor stack 132 wafer between a range of substantially 180 degrees.

Figure 2A:
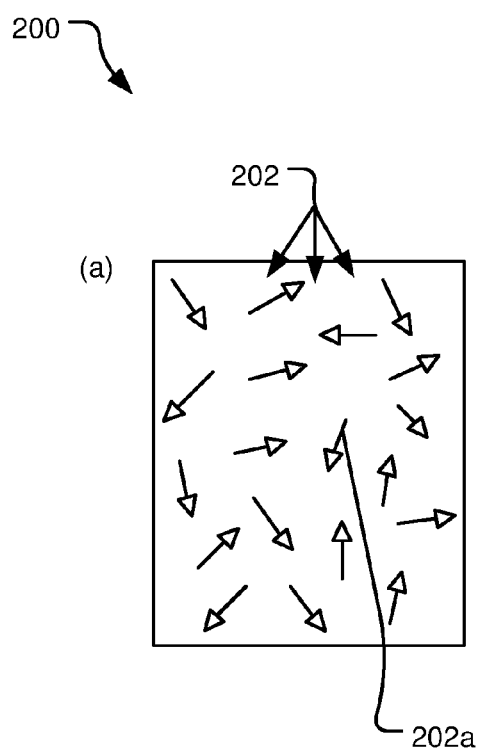
FIGS. 2a and 2b illustrate example magnetic structure of top layer of AFM at AFM/PL interface before and after anneal.
Figure 2B:
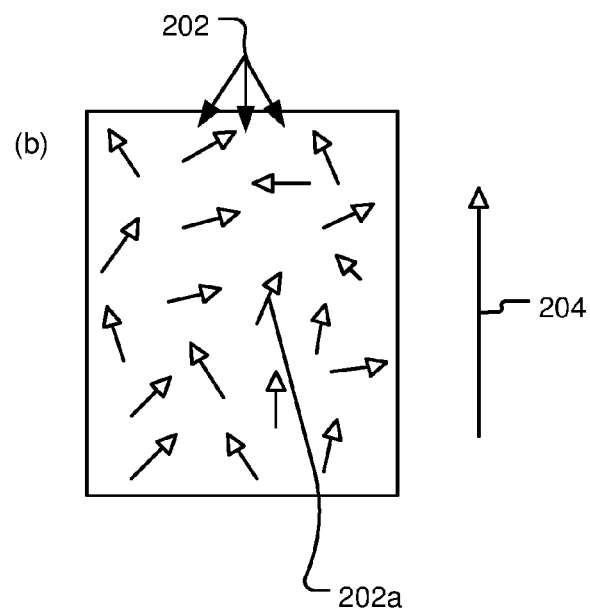

FIGS. 2a and 2b illustrate example magnetic structure of top layers of AFM at AFM/PL interface 200, before and after anneal, respectively, in one implementation. Such an interface 200 may be, for example, between the AFM layer 152 and the PL layer of the SAF layer 154, as shown in FIG. 1. However, such an interface can be at any location between an AFM layer and a PL in a sensor. Specifically, FIG. 2a shows the orientation of easy axes in AFM grains 202 as deposited, prior to high temperature anneal. As shown, the grain orientations are pointed in different, at-random, in-plane directions.

FIG. 2b shows the magnetic structure of top layer of AFM at AFM/PL interface of FIG. 2a after anneal. During a high temperature anneal using the external magnetic field 204, torque provided by a ferromagnetic layer, to the independent AFM grains 202 orients the AFM grains in the direction of the external magnetic field 204. Here, the desired direction is pointing up, as in direction of the external magnetic field 204. For example, grain 202a, which is pointing down in FIG. 2a before anneal, points upward in FIG. 2b after anneal. As a result of the anneal process, magnetic orientations of the AFM grains 202 have been rotated by the static external magnetic field 204 during anneal. In absence of any external field, the AFM grains 202 after anneal relax to the closest easy axis such that their magnetic orientation has a component in the direction of an external anneal field 204, as shown in FIG. 2b.

Figure 3A:
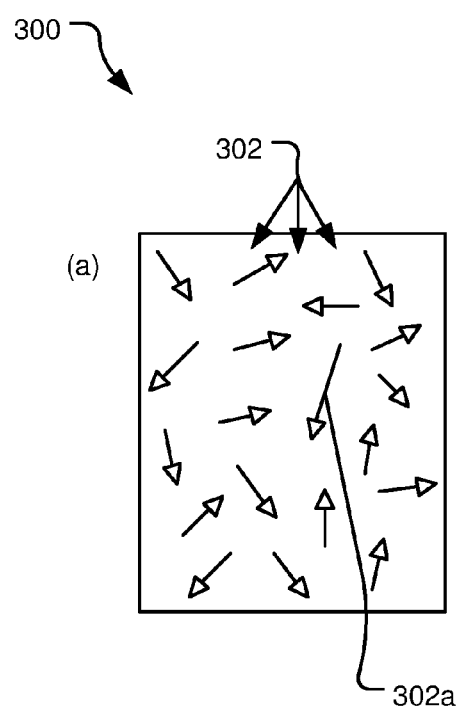
FIGS. 3a and 3b illustrate an alternative example magnetic structure of top layer of AFM at AFM/PL interface before and after anneal.
Figure 3B:
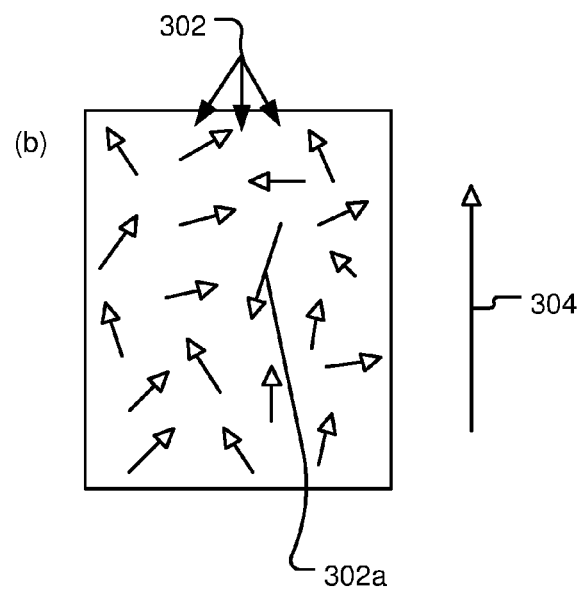

FIGS. 3a and 3b illustrate example magnetic structure of top layer of AFM at AFM/PL interface 300, before and after anneal, respectively, in other implementations. FIG. 3a shows the orientation of easy axes in AFM grains 302 as deposited, prior to a high temperature anneal. As shown, the grain orientations are pointed in different directions. FIG. 3b shows the magnetic structure of top layer of AFM at AFM/PL interface of FIG. 3a after anneal. Here, during high temperature anneal using the external magnetic field 304, torque provided by a ferromagnetic layer to various independent AFM grains 302 is not completely successful in orienting each grain to have a component in the direction of the external magnetic field 304.

Specifically, the desired direction of the AFM grains is pointing up, as in the direction of the external magnetic field 304. For example, grain 302a, which is pointing down in FIG. 3a before anneal, still points downward in FIG. 3b after anneal. Grain 302a, with magnetic orientation nearly opposite to the orientation of anneal, does not flip. The torque exerted by a ferromagnetic layer during anneal is not sufficient to re-orient the grain 302a because of very acute angle between the direction 304 of the external field orientation and the easy axis of grain 302a. The switching or reorientation of the grain 302a is especially difficult if the grain 302a is large. Thus, not all of the AFM grains 302 may be rotated by a static magnetic field during anneal. Ultimately, the misorientation of grain 302a (especially as a larger grain) makes the layer (and sensor) prone to instabilities and can cause other AFM grains within the sensor to flip. The disclosed technology focuses on better setting of the AFM grains 302 during anneal.

Figure 4:
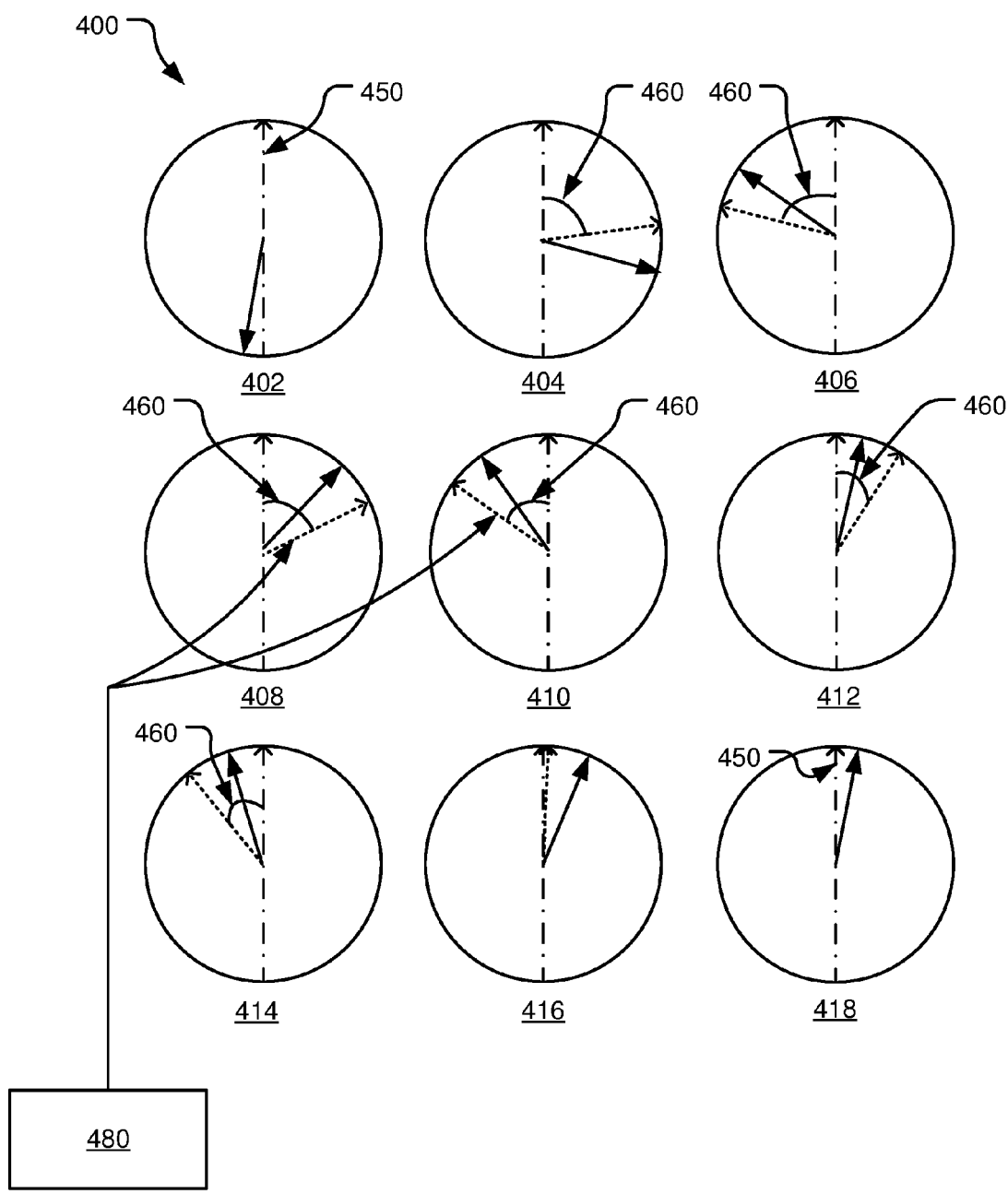
FIG. 4 illustrates an example of an evolution of magnetic orientation of an AFM grain during a rocking anneal process.

Referring to FIG. 4, the evolution of magnetic orientation of an AFM grain during various intermediate stages 400 of the rocking anneal method disclosed herein is shown. The dotted arrows show effective instantaneous orientations of the external magnetic field applied to the AFM/PL structure of a sensor stack by an external field magnetic field generator 480. The bold arrows show the magnetic orientation of the AFM grain. The disclosed rocking anneal method enables setting orientation of the grain that could not be set under a static field anneal by effectively increasing the torque applied to the grain by the PL through a more favorable angle between the external magnetic field and the magnetic orientation of AFM grain.

In initial stage 402, the bold arrow shows the starting position of the grain orientation. The desired orientation of the pinning is illustrated by the arrow 450. Between the stages 404 and 416, the external magnetic field applied to the AFM/PL structure is rocked substantially between a range of 180 degrees. For example, in stage 404, the external magnetic field (shown by the dotted line) is applied at an angle 460 of substantially 90° to the desired pinning field orientation 450. This creates a high level of torque on the grain and helps turn the magnetic orientation of the grain to be in the direction shown by the solid line at stage 404.

Then, the external magnetic field is rocked, for example, from an angle 460 of −90° to +80° to the desired pinning field orientation 450, as can be seen in stage 406. Then, the magnetic field is rocked from an angle 460 of +80° to −70° to the desired pinning field orientation 450, as seen in stage 408. Then, the magnetic field is rocked from an angle 460 of −70° to +60° to the pinning field orientation 450, as seen in stage 410. Then, the magnetic field is rocked from an angle 460 of +60° to −50° to the desired pinning field orientation 450, as seen in stage 412. Then, the magnetic field is rocked from an angle 460 of −50° to +40° to the desired pinning field orientation 450, as seen in stage 414.

This rocking process continues, wherein the rocking angle gradually decreases, as seen in stage 416, until finally a 0° orientation to the desired pinning field orientation 450 is reached, as seen in stage 418. The series of high torques resulting from the rocking of the effective external magnetic field helps drag the magnetization of AFM grain (that was originally oriented at close to 180° to the desired pinning field orientation 450) and, upon removal of the field, the magnetization relaxes to an easy axis closest to 0° orientation rather than stay at an easy axis close to 180° to the desired pinning field orientation 450.

Note that in the method disclosed in FIG. 4, the external magnetic field is rocked over substantially a range of 180°, in an alternative implementation a different range may be used. For example, a range of effective angles may be between −45° to +45°, etc. Furthermore, while the rocking of the external magnetic field is shown to be discreet where the external magnetic field at each of the various stages 404 to 416 is applied for a predetermined amount of time, in an alternative implementation, such rocking may be done in a continuous manner. Moreover, while the method described in FIG. 4 illustrates rocking the external magnetic field with the wafer containing the AFM/PL structure in a static position, in an alternative implementation, the external magnetic field may be static, but the wafer containing the AFM/PL structure is rocked so as to achieve an effective rocking of the magnetic field applied to the AFM/PL structure.

Figure 5:
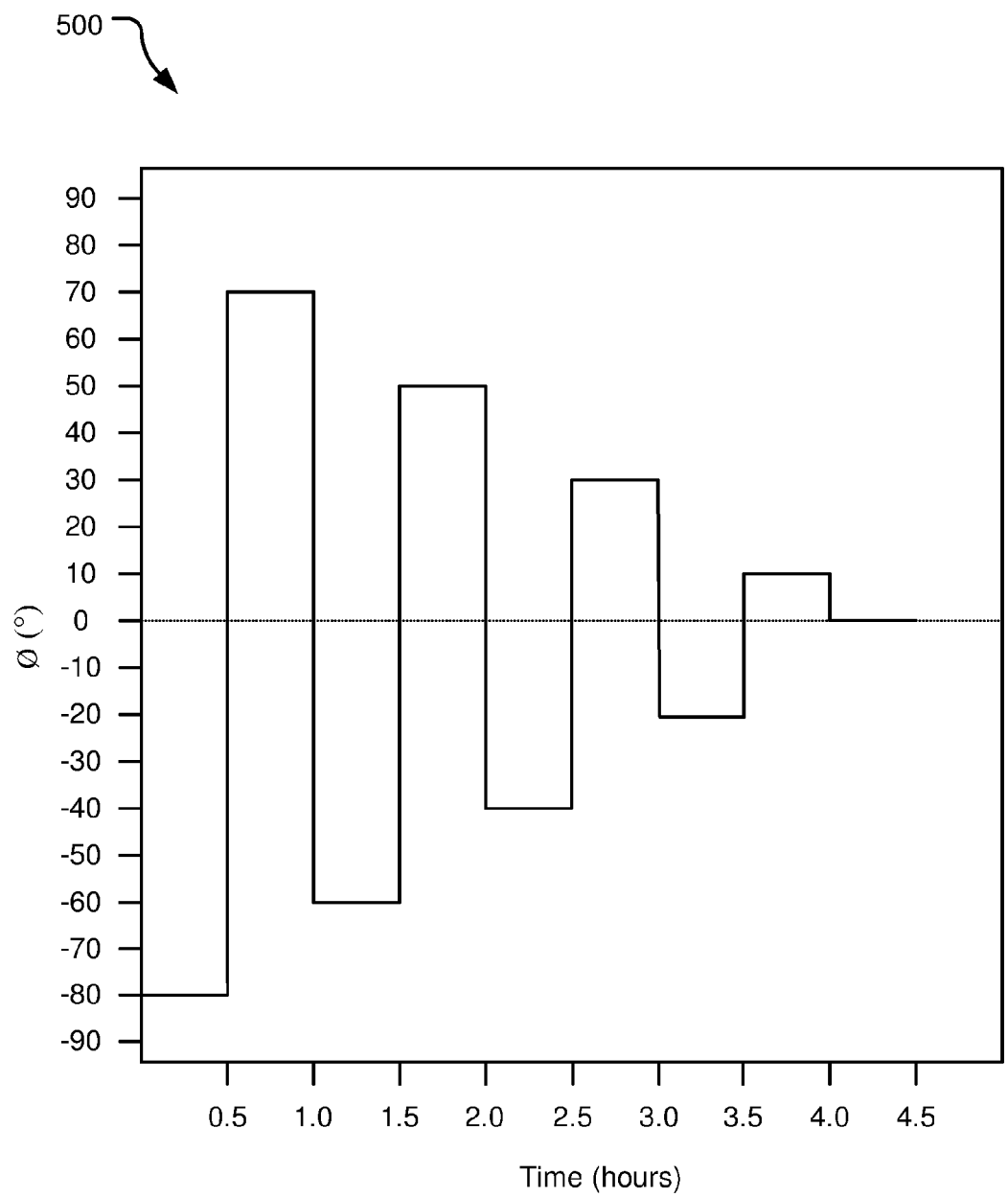
FIG. 5 illustrates an example graph showing an example timeline for rocking an effective annealing field.

FIG. 5 illustrates an example graph 500 showing an example timeline for rocking an effective annealing field between a plurality of angles Ø (°) that the applied magnetic field makes with the desired direction of pinning field in the AFM/PL structure. This timeline is discrete. Specifically, FIG. 5 shows an example rocking anneal method, wherein the rocking begins at time 0 hours when effective external magnetic field is applied to the AFM/PL structure at approximately −80° compared to the desired pinning field orientation. Subsequently, the effective external magnetic field applied to the AFM/PL structure is rocked to an angle of +70° at approximately 0.5 hours, then rocked to an angle of −60° at approximately 1.0 hours. At approximately 1.5 hours, the angle of the effective external field is rocked to +50°. At approximately 2.0 hours, the angle of the effective external field is rocked to −40°. The angle of the effective external field is rocked to +30° at approximately 2.5 hours. The angle of the effective external field is rocked to gradually decrease over time. The angle of the effective external field is rocked to −20° at approximately 3.0 hours and to +10° at approximately 3.5 hours. After approximately 4.0 hours, the orientation of the effective external field coincides with the desired orientation of pinning field. The time intervals for rocking as well as the angles illustrated in FIG. 5 may vary in different implementations. In any of the above-described steps, the magnitude of the external magnetic field is sufficiently high to saturate the magnetization of the PL. The external magnetic field may be high enough to saturate the PL magnetization.

By rocking the field back and forth periodically during the anneal, the magnetic orientation of a larger number of AFM grains may be set along a preferred direction than for the case of static field anneal of the same temperature and duration.

Figure 6:
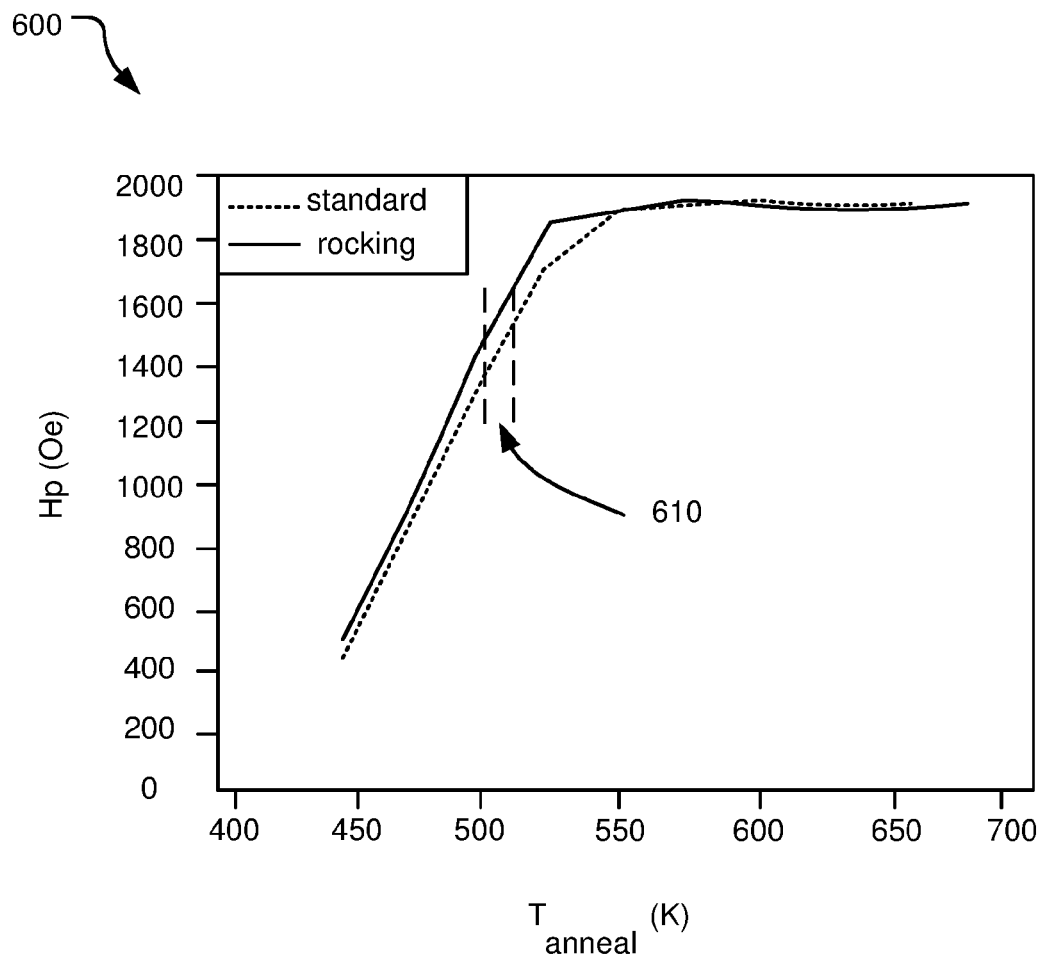
FIG. 6 illustrates an example graph of achieved pinning field vs. anneal temperature resulting from using the technology disclosed herein.

FIG. 6 illustrates an example graph of achieved pinning field vs. anneal temperature 600 resulting from the using the technology disclosed herein. The plots are the result of micromagnetic simulations assuming the value of interface exchange of 2.5 erg/cm$^2$. Specifically, FIG. 6 illustrates the AFM pinning strength achieved under the disclosed rocking anneal method with the field application timeline shown in FIG. 5 as compared to the standard static anneal method at various anneal temperatures. The strength of the AFM field upon the PL is characterized by pinning field (magnetic field Hp). With the exchange at the interface between the PL and each individual AFM grain being the same, higher values of the pinning field achieved for same temperatures of anneal are indication of an improved orientation of AFM grains in the case of rocking field anneal.

Specifically, the graph 600 shows the magnetic field Hp (measured in Oe) vs. temperature $T_{anneal}$ (measured in K or Kelvin), in one implementation. Here, it is shown that a higher pinning strength is achieved with the rocking anneal method for the same levels of annealing temperatures. Specifically, the pinning strength values of the rocking anneal method (bold line) are greater than the standard anneal method (dotted line) from various temperatures values of between the range of approximately 450K to 550K. For example, at 500K anneal temperature, the pinning strength of AFM, achieved using the standard anneal method is only about 1300 Oe, whereas the pinning strength of AFM, achieved using the rocking anneal method is about 1400 Oe. As a result, by using the technology disclosed herein, same pinning field (or same level of AFM grain alignment) may be achieved, for example, at approximately 10K lower temperature compared to the standard anneal process, as shown by 610. The higher pinning strength results from more AFM grains with switched magnetic orientation and therefore, more successful AFM setting achieved using the rocking anneal method.

Figure 7:
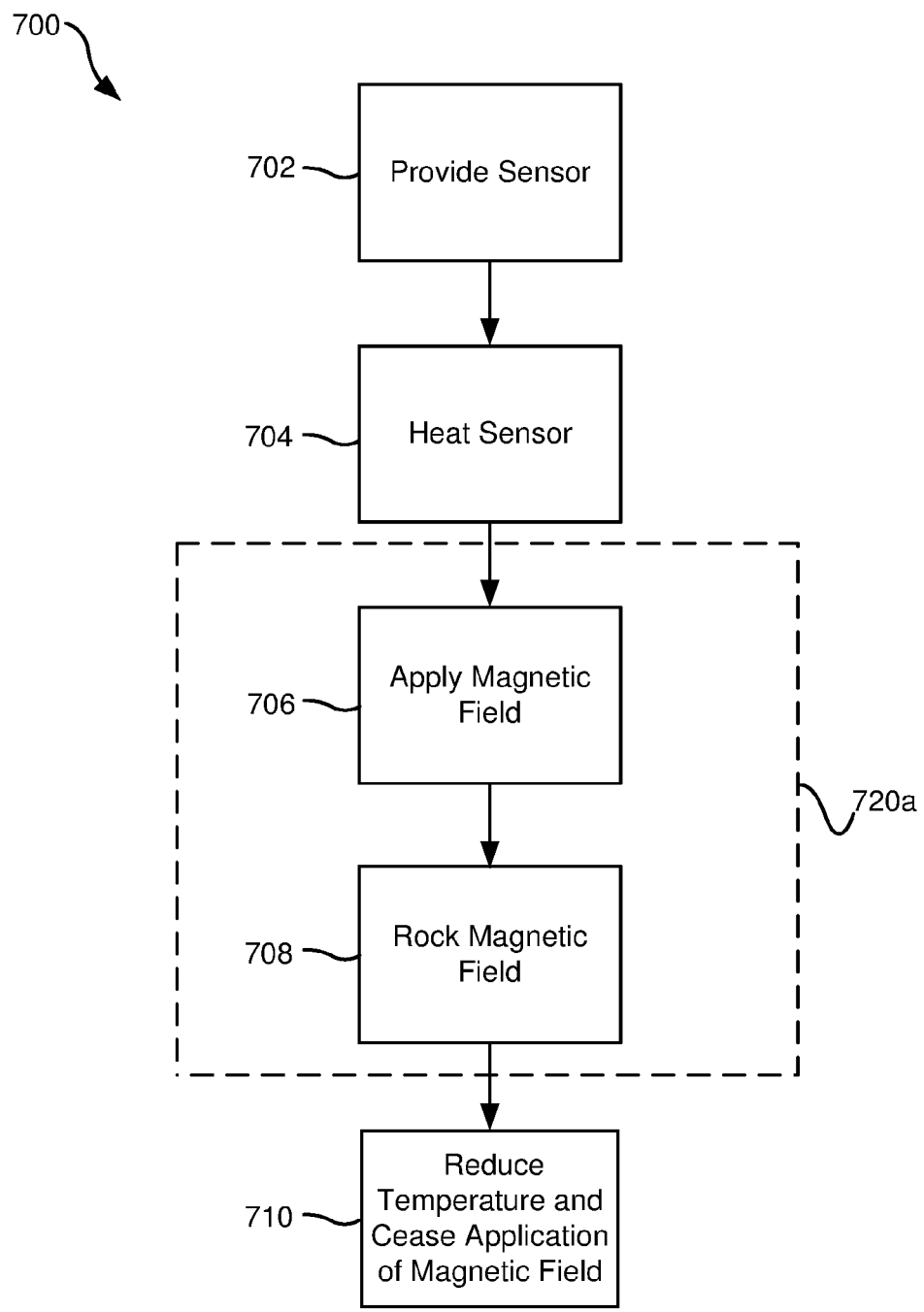
FIG. 7 illustrates operations illustrating an example rocking anneal method.

FIG. 7 illustrates example operations 700 illustrating an example rocking anneal method. An operation 702 locates a sensor stack including an AFM/PL structure in an apparatus used for providing an external magnetic field to the sensor stack. The sensor stack, including the AFM/PL structure is heated in a heating operation 704.

At a certain temperature, an external magnetic field may be applied to the sensor stack including the AFM/PL structure in a magnetic field application operation 706. The external magnetic field aligns the PL.

The external magnetic field is then rocked between a first positive angle and a second negative angle compared to a desired direction of pinning field orientation in a rocking anneal operation 708. For example, the angle between the external magnetic field and the desired direction of orientation of pinning may be rocked from +90 to −90°. The amplitude of the angle between the direction of the external magnetic field and the desired direction of pinning field in the AFM/PL structure is decreased gradually during operation 708. Once the external magnetic field has substantially reached a desired direction of pinning field orientation, the rocking of the effective external magnetic field ceases. The temperature is decreased to room temperature in an operation 710.

Several operations in operations 700 may be performed at the same time, interchangeably, and repeated multiple times. For example, the magnetic field application operation 706 of applying the magnetic field and the rocking anneal operation 708 of rocking the magnetic field may occur interchangeable and repeatedly, or at the same time, in an operation 720a. In another implementation, operations 706 and 708 may be carried out during the heating operation 704.

The above specification, examples, and data provide a complete description of the structure and use of example implementations of the invention. Since many implementations of the invention can be made without departing from the spirit and scope of the invention, the invention resides in the claims hereinafter appended. Furthermore, structural features of the different implementations may be combined in yet another implementation without departing from the recited claims. The implementations described above and other implementations are within the scope of the following claims.

What is claimed is:

1. A system, comprising:
    an external magnetic field generator, wherein the external magnetic field generator is configured to rock an effective annealing magnetic field between a first positive angle and a second negative angle compared to a desired pinning field orientation in an AFM/PL structure, wherein an angular amplitude of the effective annealing magnetic field between the first positive angle and the second negative angle gradually decreases towards the desired pinning field orientation in the AFM/PL structure.

2. The system of claim 1, wherein maximum difference in angular amplitude between the first positive angle and the second negative angle is approximately 180°.

3. The system of claim 1, wherein an AFM grain of the AFM/PL structure has magnetic anisotropy along at least one axis.

4. The system of claim 1, wherein the external magnetic field generator is configured to rock a magnetic field applied to the AFM/PL structure.

5. The system of claim 1, wherein the external magnetic field generator is configured to rock the effective annealing magnetic field in a continuous manner.

6. The system of claim 1, wherein the external magnetic field generator is configured to rock the effective annealing magnetic field in a discrete manner.

\* \* \* \* \*